United States Patent
Albrecht et al.

(10) Patent No.: US 9,490,620 B1
(45) Date of Patent: Nov. 8, 2016

(54) LOW PERMEABILITY ELECTRICAL FEED-THROUGH

(71) Applicant: HGST Netherlands B.V., Amsterdam (NL)

(72) Inventors: Thomas R. Albrecht, San Jose, CA (US); Darya Amin-Shahidi, San Jose, CA (US); Vipin Ayanoor-Vitikkate, Palakkad (IN); Toshiki Hirano, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/858,994

(22) Filed: Sep. 18, 2015

(51) Int. Cl.
| | |
|---|---|
| G11B 33/14 | (2006.01) |
| H02G 15/013 | (2006.01) |
| H02G 1/08 | (2006.01) |
| G06F 1/18 | (2006.01) |

(52) U.S. Cl.
CPC ............ *H02G 15/013* (2013.01); *G06F 1/182* (2013.01); *G11B 33/14* (2013.01); *H02G 1/08* (2013.01)

(58) Field of Classification Search
CPC ....... G11B 17/00; G11B 17/02; G11B 17/04; G11B 33/02; G11B 33/14
USPC ................... 360/99.21–99.25, 99.2
See application file for complete search history.

(56) References Cited

U.S. PATENT DOCUMENTS

| | | | |
|---|---|---|---|
| 6,989,493 B2 | 1/2006 | Hipwell, Jr. et al. | |
| 7,019,942 B2 | 3/2006 | Gunderson et al. | |
| 7,599,147 B2 | 10/2009 | Gunderson | |
| 8,035,923 B2 | 10/2011 | Suzuki et al. | |
| 8,098,454 B2 | 1/2012 | Kouno et al. | |
| 8,194,348 B2 | 6/2012 | Jacoby et al. | |
| 8,593,760 B2 | 11/2013 | McGuire, Jr. | |
| 2011/0211279 A1* | 9/2011 | Jacoby ................ | G11B 33/122 360/99.21 |
| 2015/0139770 A1* | 5/2015 | Moura ................ | B25J 11/0095 414/744.6 |

FOREIGN PATENT DOCUMENTS

EP          0844899 B1     7/2003

* cited by examiner

*Primary Examiner* — Allen T Cao
(74) *Attorney, Agent, or Firm* — John D. Henkhaus

(57) ABSTRACT

A low permeability electrical feed-through involves a laminated structure having a conductor layer sandwiched between adjacent insulator layers, which are sandwiched between adjacent diffusion control layers, where the laminated structure provides a relatively narrow and long, high aspect ratio diffusion channel to inhibit the leakage of gas from within a sealed device to the external environment. The electrical feed-through may comprise lower and upper electrical connection pads that are positioned within different regions of the feed-through but still electrically connected by way of a first via positioned in a sealed region, the conductor layer, and a second via positioned in an external environment region.

22 Claims, 7 Drawing Sheets

LOW PERMEABILITY ELECTRICAL FEED-THROUGH

FIELD OF EMBODIMENTS

Embodiments of the invention may relate generally to hermetically sealed hard disk drives and more particularly to controlling gas leakage through an electrical feed-through.

BACKGROUND

A hard-disk drive (HDD) is a non-volatile storage device that is housed in a protective enclosure and stores digitally encoded data on one or more circular disk having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. A write head makes use of the electricity flowing through a coil, which produces a magnetic field. Electrical pulses are sent to the write head, with different patterns of positive and negative currents. The current n the coil of the write head induces a magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. For example, operating an HDD in helium reduces the drag force acting on the spinning disk stack and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDDs is also increased due to low humidity, less sensitivity to altitude and external pressure variations, and the absence of corrosive gases or contaminants.

Electronic systems that require hermetically sealed internal volume (e.g., a lighter-than-air gas filled, sealed HDD) need a way of connecting electrical lines through the enclosure. This is typically accomplished with a hermetic electrical connector, or electrical "feed-through". One possible approach may involve the use of a low permeability but relatively expensive feed-through, such as glass-metal feed-through. Another approach may involve the use of a low-cost printed circuit board (PCB) feed-through, but these typically have a higher leak rate.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are generally directed at a low permeability electrical feed-through and a hermetically-sealed hard disk drive (HDD) comprising such a low permeability feed-through. The low permeability electrical feed-through involves a laminated structure having a conductor layer sandwiched between adjacent insulator layers, which are sandwiched between adjacent diffusion control layers, where the laminated structure provides a high aspect ratio diffusion channel (i.e., relatively narrow and long) to inhibit the leakage of gas from within the sealed device to the external environment. Hence, the electrical feed-through may comprise lower and upper electrical connection pads that are positioned within different regions of the feed-through, but still electrically connected by way of a first via positioned in a sealed region, the conductor layer, and a second via positioned in an external environment region.

Embodiments may include a via hole that is positioned entirely within either the sealed region or the external environment region of the electrical feed-through, preferably entirely within the external environment for lower leak rate purposes. However, for any high-frequency signal transmission lines, a particular capacitance (or impedance) may be beneficial or even required. Therefore, in such a scenario a straight via-hole connection may be implemented only for the signal transmission lines that require low capacitance, where this via is positioned such that the high-frequency signal transmission lines are not routed between the diffusion control layers.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to a low permeability electrical feed-through are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of electrical feed-through for a hard disk drive (HDD). Thus, in accordance with an embodiment, a plan view illustrating an HDD 100 is shown in FIG. 1 to illustrate an exemplary operating context.

Figure 1:
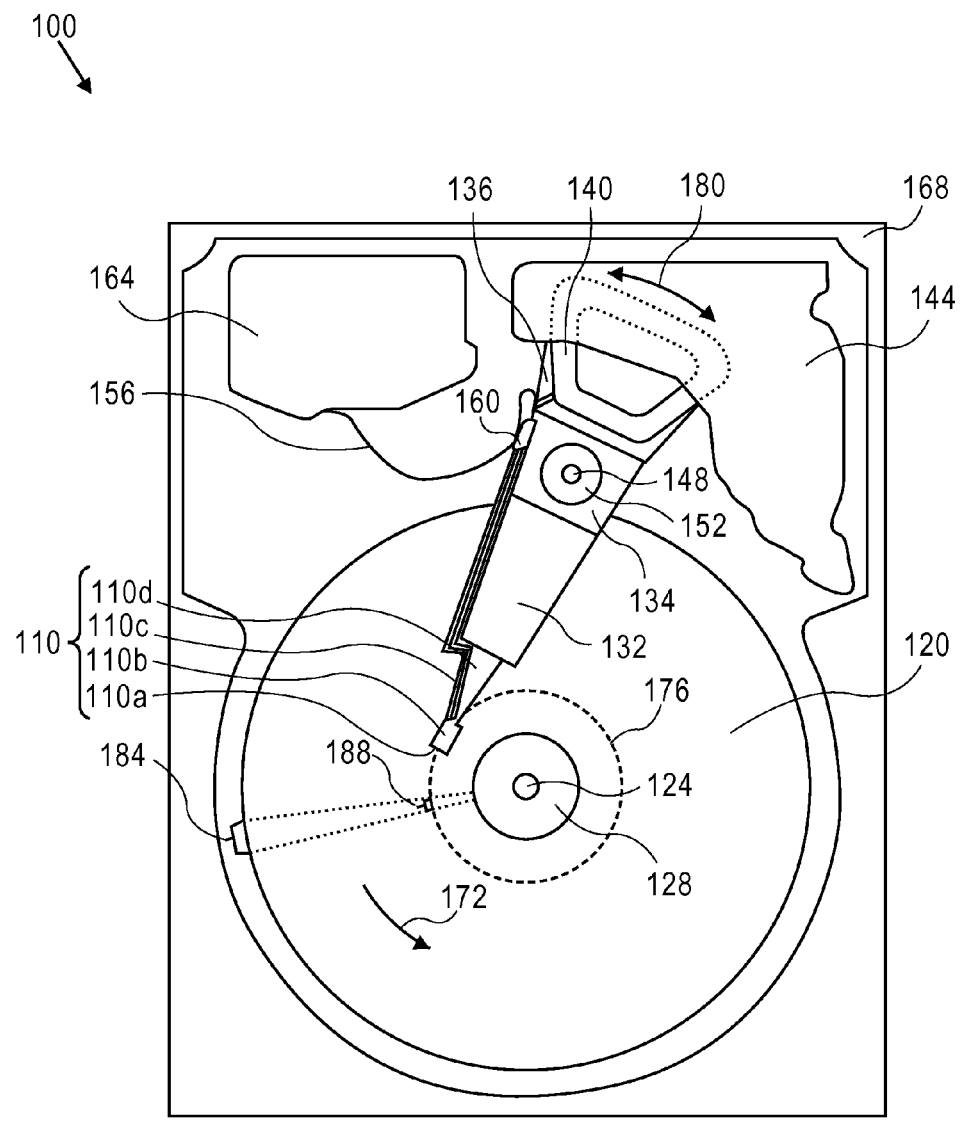
FIG. 1 is a plan view illustrating a hard disk drive (HDD), according to an embodiment.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one magnetic-recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110, to access portions of the medium 120, being mounted on a pivot-shaft 148 with an interposed pivot bearing assembly 152. In the case of an HDD having multiple disks, the carriage 134 is called an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are provided by a flexible interconnect cable 156 ("flex cable"). Interconnection between the flex cable 156 and the head 110a may be provided by an arm-electronics (AE) module 160, which may have an on-board pre-amplifier for the read signal, as well as other read-channel and write-channel electronic components. The AE module 160 may be attached to the carriage 134 as shown. The flex cable 156 is coupled to an electrical-connector block 164, which provides electrical communication through electrical feed-throughs provided by an HDD housing 168. The HDD housing 168, also referred to as a base, in conjunction with an HDD cover provides a sealed, protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 commonly creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium or nitrogen for non-limiting examples, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector"), for example, sectored track portion 188. Each sectored track portion 188 may be composed of recorded data and a header containing a servo-burst-signal pattern, for example, an ABCD-servo-burst-signal pattern, which is information that identifies the track 176, and error correction code information. In accessing the track 176, the read element of the head 110a of the HGA 110 reads the servo-burst-signal pattern which provides a position-error-signal (PES) to the servo electronics, which controls the electrical signal provided to the voice coil 140 of the VCM, enabling the head 110a to follow the track 176. Upon finding the track 176 and identifying a particular sectored track portion 188, the head 110a either reads data from the track 176 or writes data to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass a data storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differs, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Low Permeability Electrical Feed-Through

The term "hermetic" will be understood to describe a sealing arrangement designed to have nominally no (or negligible) gaseous leakage or permeation paths. While terms such as "hermetic", "negligible leakage", "no leakage", etc. may be used herein, note that such a system would often still have a certain amount of permeability and, therefore, not be absolutely leak free. Hence, the concept of a desired or target "leak rate" is described elsewhere herein. As discussed, electronic systems that require hermetically sealed internal volume (e.g., a lighter-than-air gas filled, sealed HDD) need a way of connecting electrical lines through the enclosure, and there remains a challenge regarding a low leakage rate versus the cost of a suitable electrical feed-through.

Figure 2A:
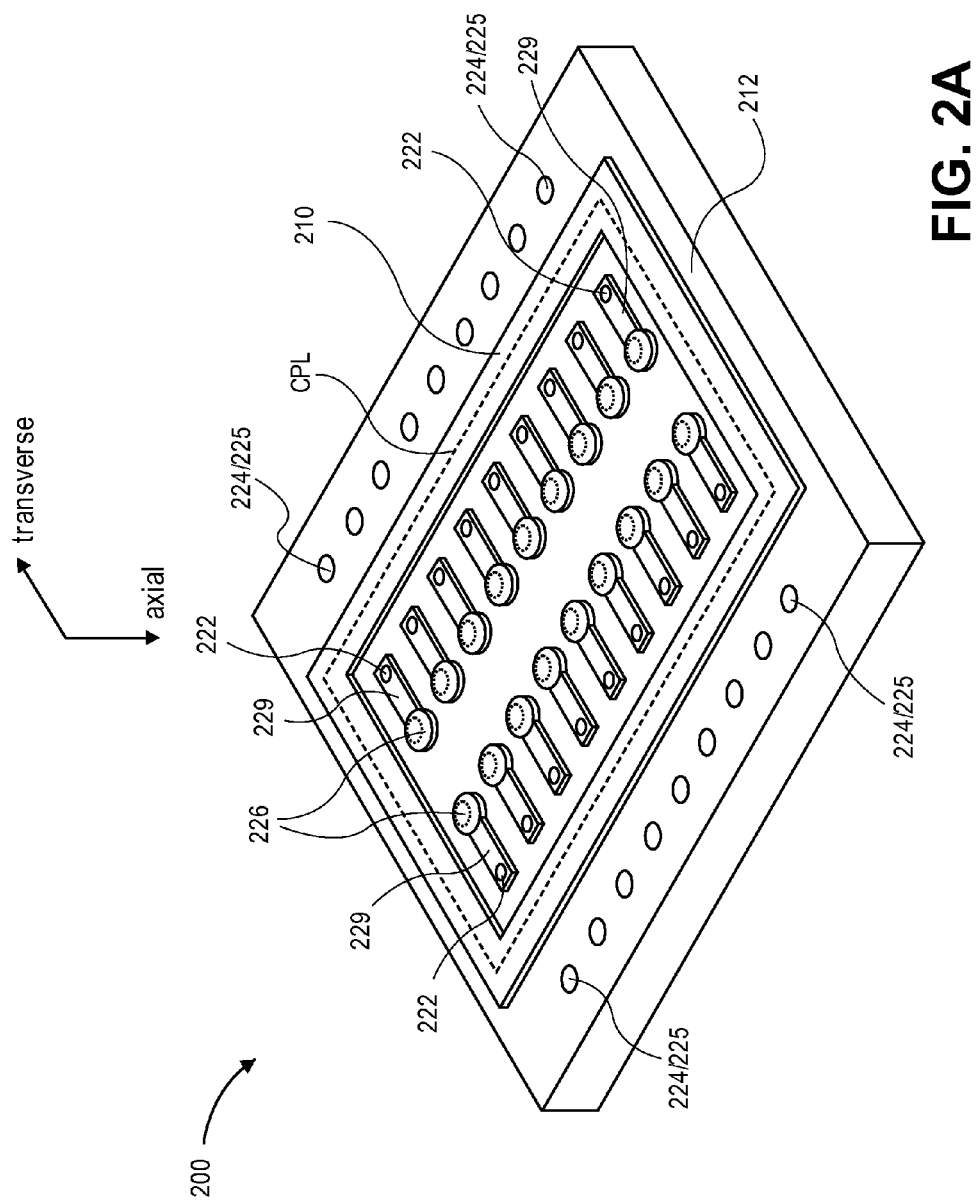
FIG. 2A is a perspective view illustrating an example electrical feed-through, according to an embodiment.

FIG. 2A is a perspective view illustrating an example electrical feed-through, according to an embodiment. Electrical feed-through 200 (hereinafter, "feed-through 200") may be referred to as a PCB (printed circuit board) based feed-through, fabricated using materials and processes generally associated with PCBs. One advantage of using PCB-based components, generally, and a PCB-based electrical feed-through, specifically, is the relatively low cost associated with a now mature fabrication approach.

A PCB-based electrical feed-through such as feed-through 200 may comprise a laminate structure having at least one insulator layer 212 (e.g., FR-4 glass-reinforced epoxy, or plastic laminate) on which at least one diffusion control layer 210 is positioned thereover. The insulator layer(s) 212 is typically fabricated with a relatively gas-permeable material and, therefore, is too permeable to prohibit leakage of certain smaller molecule gases therethrough (e.g., helium, nitrogen, etc.). Note that the diffusion control layer(s) 210 has a total channel perimeter length (CPL), the relevance of which is described elsewhere herein.

Additionally, feed-through 200 may comprise a plurality of electrical connections 226 (sometimes referred to generally as "electrical pads"), each electrically connected to a respective via 222 by way of a respective conductive layer 229. The number of electrical connections 226 constituent to an electrical feed-through such as feed-through 200 may vary from implementation to implementation. Thus, the number of electrical connections 226 illustrated in FIG. 2A is for purposes of example only. Still further, feed-through 200 may comprise at least one via 224 having a via hole 225, which are described in more detail elsewhere herein. Note also that a feed-through such as feed-through 200 need not be rectangular shaped, as the shape of feed-through 200 is illustrated as a rectangle for purposes of simplicity and example.

Figure 2B:
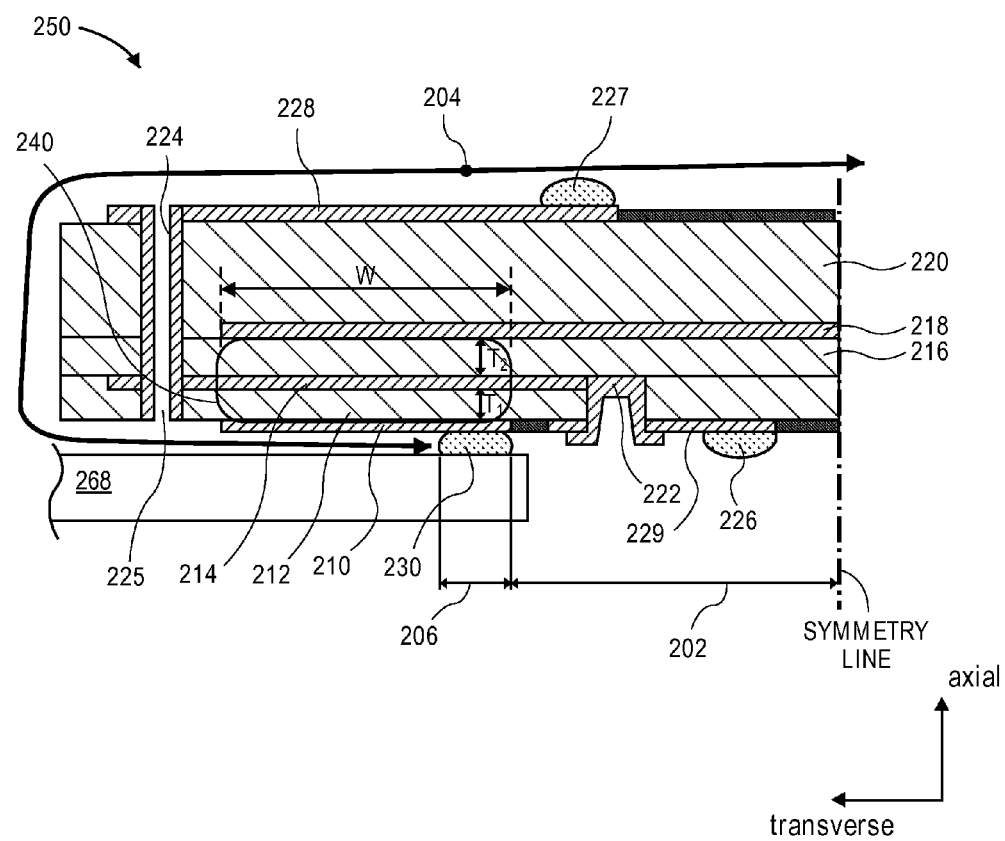
FIG. 2B is a cross-sectional side view illustrating a low permeability electrical feed-through, according to an embodiment.
Figure 3:
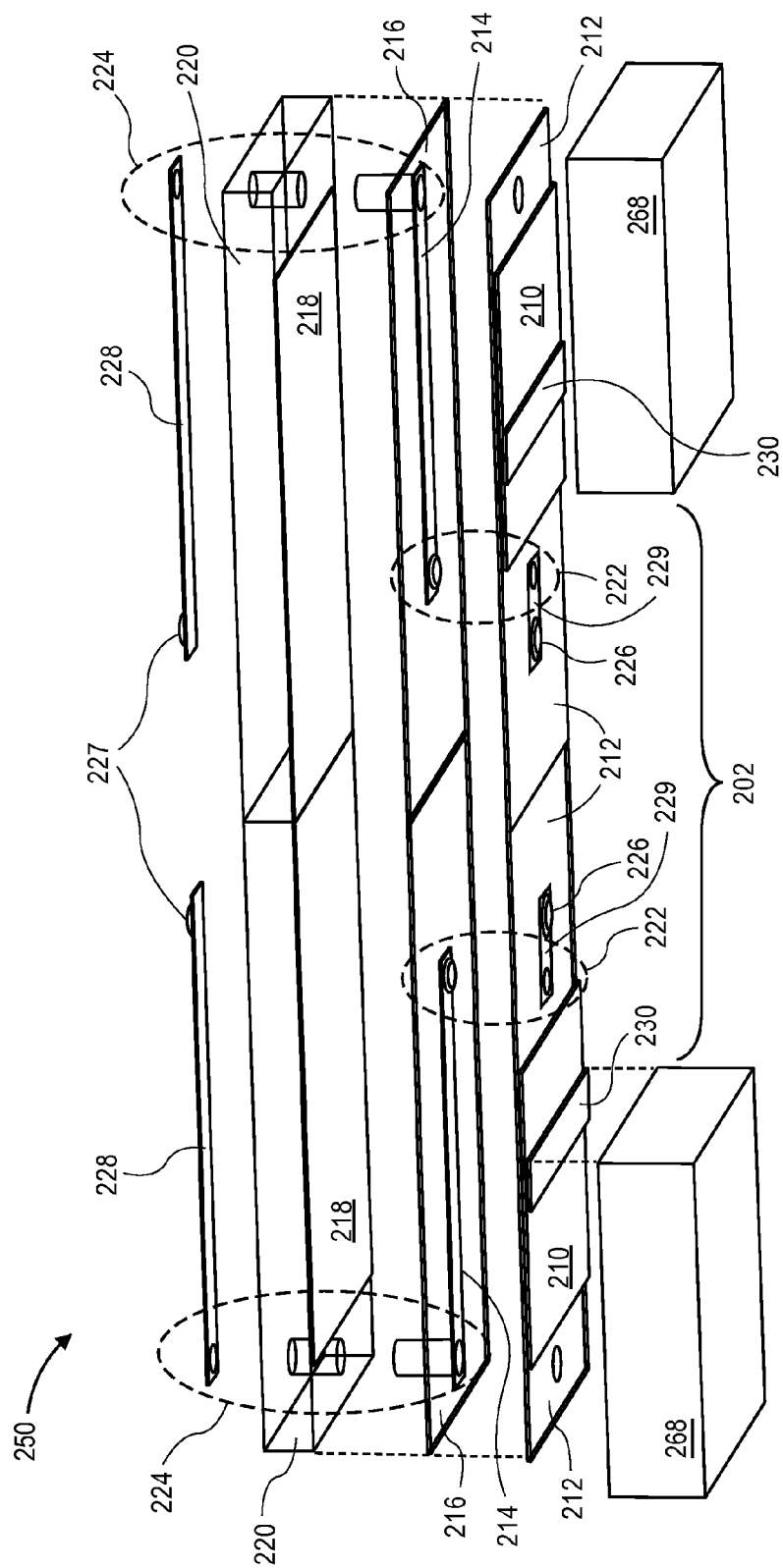
FIG. 3 is an exploded perspective view illustrating a low permeability electrical feed-through, according to an embodiment.

FIG. 2B is a cross-sectional side view illustrating a low permeability electrical feed-through, according to an embodiment. For a non-limiting example, the low permeability electrical feed-through 250 (hereinafter, "feed-through 250") of FIG. 2B may be a cross-sectional view of the electrical feed-through 200 of FIG. 2A, but in the opposite direction (i.e., the perspective view of feed-through 200 of FIG. 2A is of the bottom surface(s) of the feed-through 250 of FIG. 2B). FIG. 3 is an exploded perspective view illustrating a low permeability electrical feed-through, according to an embodiment, such as feed-through 250 of FIG. 2B.

One possible implementation of a low permeability electrical feed-through such a feed-through 250 may be for use with a sealed hard disk drive that includes a hermetically sealed gas-filled (e.g., a lighter-than-air type gas, such as helium, nitrogen, etc., for non-limiting examples) enclosure that has an opening extending through an HDD base 268 (e.g., similar to a hermetically-sealed version of housing 168 of FIG. 1). In such an implementation, an electrical connector may be disposed inside the enclosure and adjacent to the opening, and which can be electrically connected to a low permeability electrical feed-through such as feed-through 250 which spans the opening. For example, an electrical connector may be electrically connected with an internal HDD flexible interconnect cable (e.g., flex cable 156 of FIG. 1), and with the feed-through 250 by way of electrical pads 226. Alternately, an internal HDD flexible interconnect cable (e.g., flex cable 156 of FIG. 1) may be directly connected with the feed-through 250 by way of electrical pads 226. Broadly, feed-through 200, 250 serve the purpose of facilitating electrical contact and connection between the outside and inside of the hermetically sealed cavity/enclosure.

Feed-through 250 may be characterized as comprising three different regions: (1) a "sealed region" 202 that is exposed to the HDD internal gas (e.g., helium, nitrogen, etc.); (2) an "external environment region" 204 that is exposed to the external environment (e.g., ambient air); and (3) an "attachment region" 206 that is attached to a hermetically-sealed enclosure, such as base 268, by way of an attachment 230. Being described as a "low permeability" electrical feed-through, feed-through 250 is structurally configured such that negligible to no leakage of the HDD internal gas is permitted from inside an HDD to the external environment.

According to embodiments, feed-through 250 comprises multiple layers of low permeability material (for non-limiting examples, a metal such as copper, or glass) and insulator material (for a non-limiting example, FR-4), laminated in a particular manner as follows. Feed-through 250 comprises a first diffusion control layer 210 extending uninterrupted from attachment region 206 a distance along the external environment region 204. According to an embodiment, the first diffusion control layer is a metal, such as copper for a non-limiting example. According to another embodiment, the first diffusion control layer is composed of a low permeability (low diffusion rate) dielectric, such as glass according to a related embodiment. According to an embodiment, the first diffusion control layer 210 overlaps with the attachment region 206, in that the first diffusion control layer 210 is attached to the base 268 using, for non-limiting examples, an adhesive or solder (generally, attachment 230). Feed-through 250 further comprises a first insulator layer 212 on top of the first diffusion control layer 210, where the first insulator layer 212 extends from a first via 222 positioned within the sealed region 202 to a second via 224 positioned within the external environment region 204 which is outside of the sealed region 202. Feed-through 250 further comprises a conductor layer 214 on top of the first insulator layer 212, whereby the conductor layer 214 electrically connects the first via 222 and the second via 224. Conductor layer 214 is patterned to form electrical connection lines to carry signals back and forth between the first via 222 (and any electrical line, pin, post, etc. electrically and/or mechanically connected to the first via 222) and the second via 224 (and any electrical line, pin, post, etc. electrically and/or mechanically connected to the second via 224). For example, conductor layer may carry signals from an internal flexible interconnect cable (e.g., flex cable 156 of FIG. 1) electrically connected to electrical pad 226 to an external HDD PCB (i.e., attached to the HDD) electrically connected to electrical pad 227.

Feed-through 250 further comprises a second insulator layer 216 on top of the conductor layer 214, and a second diffusion control layer 218 on top of the second insulator layer 216 and extending uninterrupted across a majority of the length of the feed-through 250. According to an embodiment, the second diffusion control layer is a metal, such as copper for a non-limiting example. According to another embodiment, the second diffusion control layer is composed of a low permeability (low diffusion rate) dielectric, such as glass according to a related embodiment. An additional optional insulator layer 220 may be present on top of the second diffusion control layer 218, such as for mechanical stability. Regardless, the first diffusion control layer 210, the first insulator layer 212, the second insulator layer 216, and the second diffusion control layer 218 form a long and narrow diffusion path for any gas contained within an HDD enclosure such as base 268, i.e., a diffusion path for the diffusion of gas from the sealed region 202 of feed-through 250 to the external environment region 204 of feed-through 250, which is diffusion (i.e., leakage) that is desirable to control and inhibit. While the conductor layer 214 is sandwiched within the other layers of the diffusion channel 240, the conductor layer comprises a narrow metal line(s) and, therefore, does not function as a diffusion barrier to a practical degree.

Together, the foregoing four layers form a long and narrow (high aspect ratio) diffusion channel 240, where the diffusion from the diffusion channel 240 is controlled by way of the aspect ratio, as follows. The diffusion channel 240 has a corresponding aspect ratio characterized by a ratio of the width of the diffusion channel 240 over the sum of the respective height of each of the first insulator layer 212 and the second insulator layer 216, which are the more permeable material layers and hence the layers through which the gas primarily passes or leaks. This aspect ratio of the diffusion channel 240 thus dictates the amount of gas that may leak from the hermetically-sealed internal environment of an HDD through the feed-through 250 and into the external environment, whereby a higher aspect ratio results in a lower permeability feed-through. Hence, according to an embodiment, to meet a target leak rate, Q, for the feed-through 250, the following equation applies:

$$Q > K*T*CPL*dP/W; \quad (1)$$

where,
K=a constant, representing the permeability of the gas,
T=the diffusion channel height (FIG. 2B) in axial direction,
CPL=the diffusion channel perimeter length (FIG. 2A),
W=the diffusion channel width (in transverse direction of FIG. 2B), and
dP=the pressure drop of the gas across the diffusion channel (i.e., along the width, W, of the diffusion channel).

Hence, a long and narrow (high aspect ratio) diffusion channel inhibits leakage of gas from the internal sealed environment. According to an embodiment, for a target (desirable) leak rate, Q, for the gas within the sealed environment, the following aspect ratio applies:

$$\text{aspect ratio} = W/T > K*CPL*dP/Q; \quad (2)$$

where $T=T_1+T_2$, in the case of feed-through 250 of FIG. 2B.

Stated otherwise, for a target gas leak rate, Q, the aspect ratio of the diffusion channel 240 is greater than the product of (a) a constant, K, representing the permeability of the gas; (b) the channel perimeter length, CPL, of the diffusion channel 240; and (c) a ratio of the pressure drop of the gas along the width (in transverse direction of FIG. 2B) of the diffusion channel, dP, over the target leak rate, Q, or dP/Q.

As mentioned, conductor layer is formed to carry signals from electrical pad 226, which is positioned within the sealed region 202 of the feed-through 200, 250, to electrical pad 227, which is positioned within the external environment region 204 of the feed-through 200, 250 outside of the sealed region 202. In order to transmit signals between the sealed region 202 and the external environment region 204, according to an embodiment the first via 222, the conductor layer 214, the second via 224, and another conductor layer 228 are configured to provide an electrical path between the electrical pad 226 within the sealed region 202 and the electrical pad 227 outside of the sealed region 202 (within the external environment region 204). According to an embodiment, the second via 224 comprises a via hole 225 and the via hole 225 is positioned entirely within a single region of the feed-through 200, 250, whether it be the sealed region 202 or the external environment region 204, so that negligible or no leakage is likely to occur across the regions through the second via 224 and associated via hole 225 and the insulator around the via 224. Similarly, and as depicted in FIG. 2B, the via hole 225 is positioned entirely within the external environment region 204, effectively ensuring that no leakage occurs from the sealed region 202 by way of the via 224 and associated via hole 225.

Managing Impedance of High-Frequency Signal Transmission Lines

One consideration with the embodiment depicted in FIG. 2B is the relatively high electrical capacitance of the signal lines patterned onto conductor layer 214, which are sandwiched by two large diffusion control (e.g., metal) layers (the first diffusion control layer 210 and the second diffusion control layer 218) with two thin insulator layers (the first insulator layer 212 and the second insulator layer 216). Capacitance is proportional to the surface area of two overlapping metal surfaces and inversely proportional to the distance between the two metal surfaces.

For any high-frequency signal transmission lines, a particular capacitance (or impedance) may be beneficial or even required. Consequently, the embodiment depicted in FIG. 2B may have too high capacitance, or too low impedance, for certain signal transmission lines. In such a scenario, a straight via-hole connection may be implemented only for the signal transmission lines that require low capacitance, according to an embodiment. In the case of HDDs, there are typically only four (4) high-frequency signal transmission lines (one pair for read, one pair for write, also referred to as receive/transmit lines), and all the other lines do not necessarily need accurate impedance matching. Generally, a high-frequency signal in the context of embodiments described herein is a signal having a frequency greater than several hundreds of megahertz, in order to achieve the data rate(s) specified in relevant interface protocols (e.g., SAS, SATA) for example. Further, a high-frequency signal transmission line is in contrast with, for example, power lines, ground lines, control lines, and the like.

Figure 4:
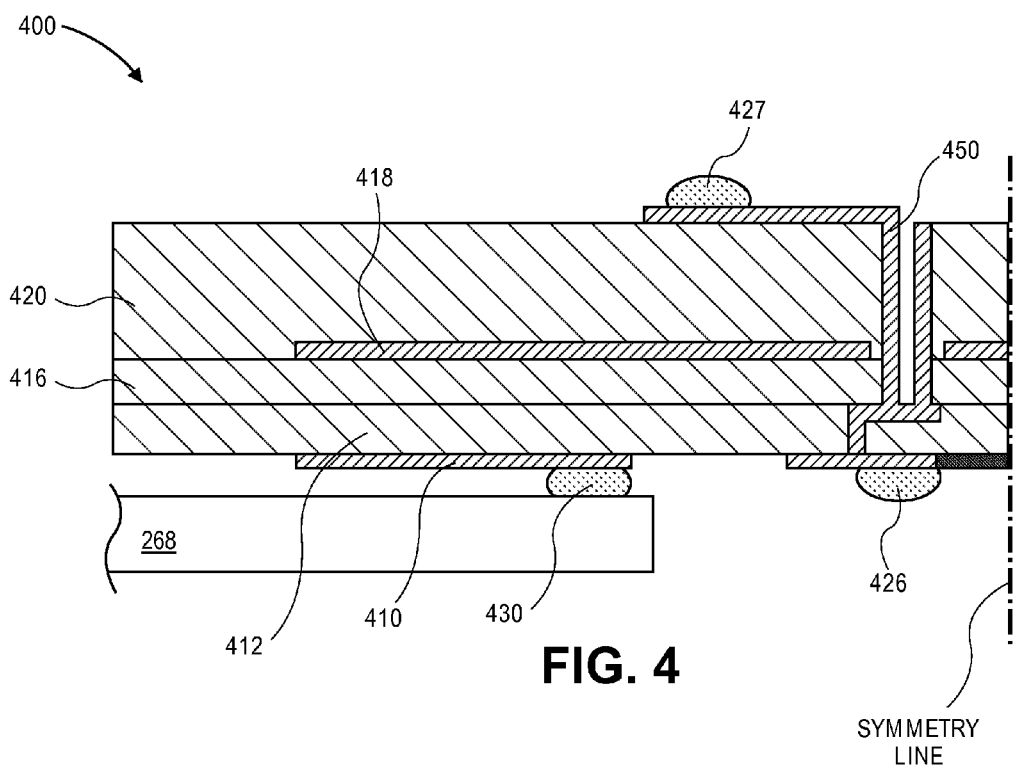
FIG. 4 is a cross-sectional side view illustrating a low permeability electrical feed-through, according to an embodiment.

FIG. 4 is a cross-sectional side view illustrating a low permeability electrical feed-through, according to an embodiment. As with the embodiments depicted in reference to FIG. 2B, one possible implementation of a low permeability electrical feed-through such as feed-through 400 may be for use with a sealed hard disk drive that includes a hermetically sealed gas-filled (e.g., a lighter-than-air type gas, such as helium, nitrogen, etc., for non-limiting examples) enclosure that has an opening extending through an HDD base 268.

As with feed-through 250 (FIG. 2B), feed-through 400 may be characterized as comprising three different regions: a "sealed region" that is exposed to the HDD internal gas (e.g., helium, nitrogen, etc.); an "external environment region" that is exposed to the external environment (e.g., ambient air); and an "attachment region" that is attached to a hermetically-sealed enclosure, such as base 268, by way of attachment 430. Being described as a "low permeability" electrical feed-through, feed-through 400 is structurally configured to limit the amount of leakage of the HDD internal gas from inside an HDD to the external environment.

As with feed-through 250, feed-through 400 comprises multiple layers of low permeability material (for non-limiting examples, a metal such as copper, or glass) and insulator material (for a non-limiting example, FR-4), laminated in a particular manner. While feed-through 400 may comprise a first diffusion control layer 410 extending uninterrupted from the attachment region a distance along the external environment region, a first insulator layer 412 on top of the first diffusion control layer 410, a second insulator layer 416 on top of the first insulator layer 412, and a second diffusion control layer 418 on top of the second insulator layer 416 and extending uninterrupted across a majority of the length of the feed-through 400, layers whose composition and functionality may be similar to like-numbered elements described in reference to the feed-through 250 of FIG. 2B, a noteworthy feature of feed-through 400 is the via 450 ("third via") electrically connecting a lower electrical pad 426 to an upper electrical pad 427. The via 450 may be used to route the high-frequency signal transmission lines introduced elsewhere herein.

Hence, according to an embodiment, an electrical feed-through (e.g., feed-through 400 and/or feed-through 250 of FIG. 2B) comprises a third via positioned within the sealed region and electrically connecting a high-frequency signal transmission line between a lower electrical connection pad and an upper electrical connection pad, where the third via is positioned such that the high-frequency signal transmission line is not routed between the first and second diffusion control layers. For example, third via 450 is positioned within the sealed region and electrically connects a high-frequency signal transmission line between a lower electrical connection pad 426 and an upper electrical connection pad 427, where the third via 450 is positioned such that the high-frequency signal transmission line is not routed between the first and second diffusion control layers 410, 418.

While use of straight via-hole connection such as via 450 may have a higher leak rate (i.e., more permeability) than the diffusion channel 240 (FIG. 2B) path, by reducing leakage from all other lines (non-high-frequency signal transmission lines) the total combined leak rate or permeability can be managed and controlled to the extent to meet a given target. Note that the embodiments depicted and described in reference to FIG. 2B and in reference to FIG. 4 may be implemented separately or together. That is, embodiments include an implementation in which high-frequency signal transmission lines (such as the read pair and the write pair) are routed from the sealed region to the external environment region by way of a straight via-hole such as via 450 (FIG. 4) between electrical pads 426, 427, thereby bypassing the region between the first and second diffusion control layers 410, 418 (and/or 210, 218 of feed-through 250 of FIG. 2B), while the non-high-frequency signal transmission lines are routed from the sealed region to the external environment region by way of via 222 and via 224 (FIG. 2B) between electrical pads 226, 227, thereby passing between the first and second diffusion control layers 210, 218 (FIG. 2B) through the controlled diffusion channel 240 by way of conductor layer 214.

Furthermore, in regards to managing the capacitance (or impedance) in association with high-frequency signal transmission lines, low diffusion rate (low permeability) dielectric material may be substituted for the foregoing uninterrupted diffusion control layers (e.g., first and second diffusion control layers 210, 218 of FIGS. 2B and 3; 410, 418 of FIG. 4), according to an embodiment. For example, glass may be used for one or more of the diffusion control layers instead of metal, and coupled with the laminate structure using a low diffusion rate adhesive, such as epoxy, thereby managing the capacitance down to a suitable level for any high-frequency signal transmission lines that route between the diffusion control layers.

Figure 5A:
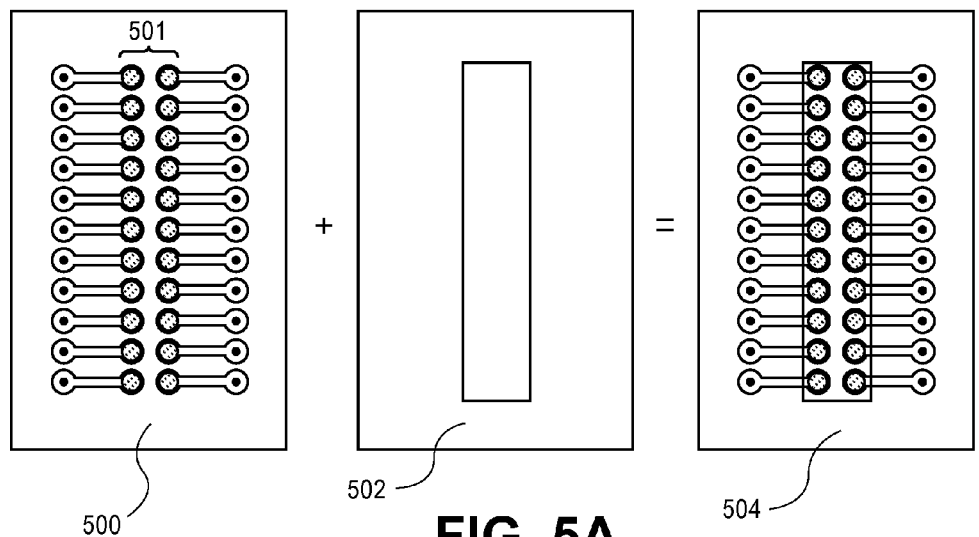
FIG. 5A is a top view illustrating the construction of a low permeability electrical feed-through, according to an embodiment.

In addition to using a low diffusion rate dielectric material for one or more of the diffusion control layers, according to an embodiment a glass layer is positioned over at least a portion of the second diffusion control layer. FIG. 5A is a top view illustrating the construction of a low permeability electrical feed-through, according to an embodiment. Feed-through 504 comprises a laminate 500 having set of electrical pads 501 (such as feed-through 250 of FIGS. 2B and 3 and/or feed-through 400 of FIG. 4), over which a low diffusion rate (low permeability) dielectric material cap 502 (e.g., glass) is adhered. The dielectric material cap 502 comprises a cut-out area corresponding to the electrical pads such that the electrical pads 501 are not covered by the dielectric material and are therefore accessible for use.

Figure 5B:
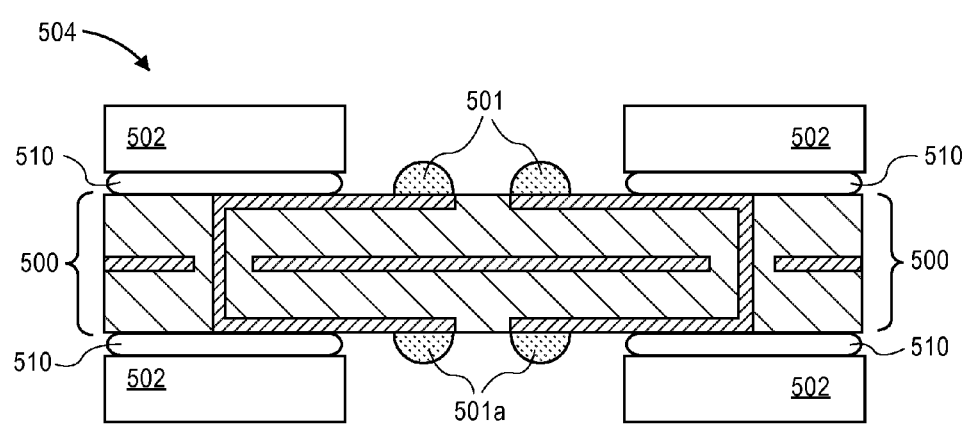
FIG. 5B is a cross-sectional side view illustrating a low permeability electrical feed-through, according to an embodiment.

Similarly, according to an embodiment a glass layer is positioned over at least a portion of the second diffusion control layer. FIG. 5B is a cross-sectional side view illustrating a low permeability electrical feed-through, according to an embodiment. Feed-through 504 comprises a laminate 500 having set of upper electrical pads 501 and lower electrical pads 501a (such as feed-through 250 of FIGS. 2B and 3 and/or feed-through 400 of FIG. 4), over both sides of which a low diffusion rate (low permeability) dielectric material cap 502 (e.g., glass) is adhered by an adhesive 510, such as a low diffusion rate adhesive like epoxy. Each upper and lower dielectric material cap 502 comprises a cut-out area corresponding to the electrical pads such that the electrical pads 501, 501a are not covered by the dielectric material and are therefore accessible for use.

Method of Sealing an Electrical Feed-Through

Figure 6:
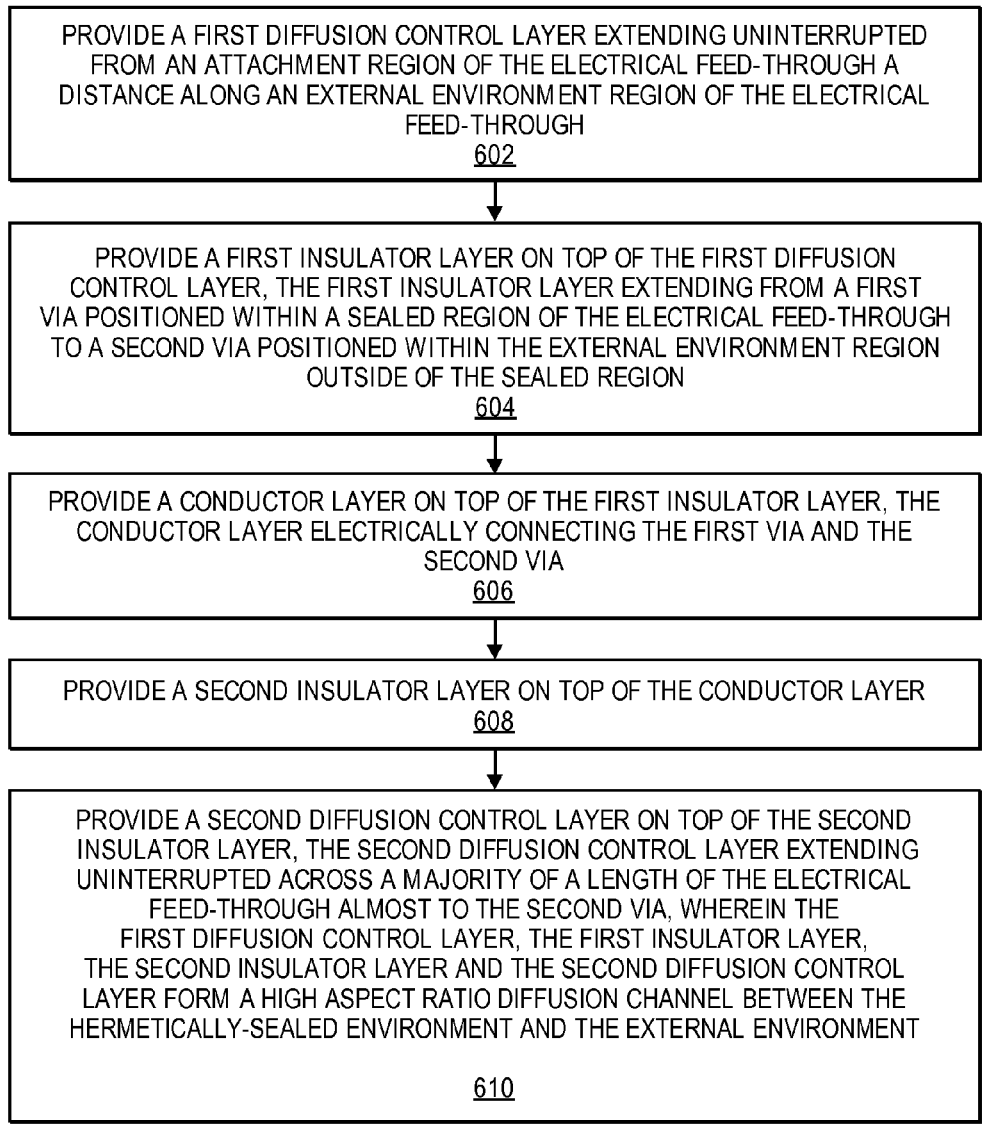
FIG. 6 is a flow diagram illustrating a method of sealing an electrical feed-through, according to an embodiment.

FIG. 6 is a flow diagram illustrating a method of sealing an electrical feed-through, according to an embodiment, where the electrical feed-through is configured to interface between a hermetically-sealed environment and an external environment. For example, the hermetically-sealed environment may be the internal cavity of a sealed hard disk drive having a lighter-than-air gas largely sealed therein.

At block 602, a first diffusion control layer is provided which extends uninterrupted from an attachment region of the electrical feed-through a distance along an external environment region of the electrical feed-through. For example, first diffusion layer 210 (FIG. 2B) is provided which extends uninterrupted from an attachment region 206 (FIG. 2B) of the electrical feed-through 250 (FIG. 2B) a distance along an external environment region 204 (FIG. 2B) of the electrical feed-through 250.

At block 604, a first insulator layer is provided on top of the first diffusion control layer, whereby the first insulator layer extends from a first via positioned within a sealed region of the electrical feed-through to a second via positioned within the external environment region which is outside of the sealed region. For example, the first insulator layer 212 (FIG. 2B) is provided on top of the first diffusion control layer 210 (FIG. 2B), whereby the first insulator layer 212 extends from a first via 222 (FIG. 2B) positioned within a sealed region 202 (FIG. 2B) of the electrical feed-through 250 (FIG. 2B) to a second via 224 (FIG. 2B) positioned within the external environment region 204 (FIG. 2B) which is outside of the sealed region 202.

At block 606, a conductor layer is provided on top of the first insulator layer, whereby the conductor layer electrically connects the first via and the second via. For example, the conductor layer 214 (FIG. 2B) is provided on top of the first insulator layer 212 (FIG. 2B), whereby the conductor layer 214 electrically connects the first via 222 (FIG. 2B) and the second via 224 (FIG. 2B).

At block 608, a second insulator layer is provided on top of the conductor layer. For example, the second insulator layer 216 (FIG. 2B) is provided on top of the conductor layer 214 (FIG. 2B).

At block 610, a second diffusion control layer is provided on top of the second insulator layer, whereby the second diffusion control layer extends uninterrupted across a majority of the length of the electrical feed-through almost to the second via, and wherein the first diffusion control layer, the first insulator layer, the second insulator layer, and the second diffusion control layer form a high aspect ratio diffusion channel between the hermetically-sealed environment and the external environment. For example, the second diffusion control layer 218 (FIG. 2B) is provided on top of the second insulator layer 216 (FIG. 2B), whereby the second diffusion control layer 218 extends uninterrupted across a majority of the length of the electrical feed-through 250 (FIG. 2B) almost to the second via 224 (FIG. 2B), and wherein the first diffusion control layer 210 (FIG. 2B), the first insulator layer 212 (FIG. 2B), the second insulator layer 216, and the second diffusion control layer 218 form a high aspect ratio diffusion channel 240 (FIG. 2B) between the hermetically-sealed environment and the external environment.

As discussed, a diffusion channel may be characterized as having an aspect ratio characterized by a ratio of the width of the diffusion channel over the height of the diffusion channel. For example, the diffusion channel 240 (FIG. 2B) may be characterized as having an aspect ratio characterized by a ratio of the width, W (FIG. 2B), of the diffusion channel 240 over the height, sum of $T_1$ and $T_2$ (FIG. 2B), of the diffusion channel 240. According to an embodiment, for a target leak rate for a gas within the hermetically-sealed internal environment, the aspect ratio of the diffusion channel is greater than the product of (a) a constant representing the permeability of the gas; (b) the channel perimeter length of the diffusion channel; and (c) the ratio of the pressure drop of the gas along the width (in transverse direction of FIG. 2B) of the diffusion channel over the target leak rate (see, e.g., equation (2)).

Furthermore, the method depicted and described in reference to FIG. 6 may be extended to include the providing of any and/or all of the additional features depicted and described in reference to FIGS. 2A-5B. For example, at least one pair of upper and lower electrical connection pads that are in different regions of the feed-through, which are electrically connected by way of the conductor layer and the first and second vias, may be provided. For another example, a third via within the sealed region of the feed-through may be provided to connect high-frequency signal transmission lines such that the lines are not routed between the diffusion control layers.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. An electrical feed-through for use in a hard disk drive and configured to interface between a hermetically-sealed environment and an external environment, the feed-through comprising:
   a first diffusion control layer extending uninterrupted from an attachment region a distance along an external environment region;
   a first insulator layer on top of said first diffusion control layer, said first insulator layer extending from a first via positioned within a sealed region to a second via positioned within said external environment region outside of said sealed region;
   a conductor layer on top of said first insulator layer, said conductor layer electrically connecting said first via and said second via;
   a second insulator layer on top of said conductor layer; and a second diffusion control layer on top of said second insulator layer, said second diffusion control layer extending uninterrupted across a majority of a length of said electrical feed-through almost to said second via, wherein said first diffusion control layer, said first insulator layer, said second insulator layer, and said second diffusion control layer form a high aspect ratio diffusion channel between said sealed region and said external environment region.

2. The electrical feed-through of claim 1, wherein said diffusion channel has an aspect ratio characterized by a ratio of the width of said diffusion channel over the sum of the heights of said first and said second insulator layers; and wherein, for a target leak rate for a gas within said sealed environment, said aspect ratio of said diffusion channel is greater than the product of (a) a constant representing the permeability of said gas, (b) a channel perimeter length of said diffusion channel, and (c) a ratio of a pressure drop of said gas along said width of said diffusion channel over said target leak rate.

3. The electrical feed-through of claim 1, wherein said first via comprises a via hole, and wherein said via hole is positioned entirely within said sealed region.

4. The electrical feed-through of claim 1, wherein said second via comprises a via hole, and wherein said via hole is positioned entirely within said external environment region.

5. The electrical feed-through of claim 1, further comprising:

at least one pair of electrical connection pads comprising a lower electrical connection pad located within said sealed region and an upper electrical connection pad located within said external environment region.

6. The electrical feed-through of claim 5, wherein said lower and upper electrical connection pads are electrically connected by way of said first via, said conductor layer, and said second via.

7. The electrical feed-through of claim 1, wherein said first and second diffusion control layers are composed of a metal.

8. The electrical feed-through of claim 1, wherein at least one of said first and second diffusion control layers is composed of a low permeability dielectric material.

9. The electrical feed-through of claim 1, wherein at least one of said first and second diffusion control layers is composed of glass.

10. The electrical feed-through of claim 1, further comprising:

a third via positioned within said sealed region and electrically connecting a high-frequency signal transmission line between a lower electrical connection pad and an upper electrical connection pad, wherein said third via is positioned such that said high-frequency signal transmission line is not routed between said first and second diffusion control layers.

11. The electrical feed-through of claim 1, further comprising:

a glass layer positioned over at least a portion of said second diffusion control layer.

12. A hermetically-sealed hard disk drive comprising:

at least one recording disk medium rotatably mounted on a spindle;

a head slider comprising a read-write transducer configured to read from and to write to said at least one disk medium;

a voice coil actuator configured to move said head slider to access portions of said at least one disk medium; and an electrical feed-through configured to interface between a hermetically-sealed internal environment and an external environment, said electrical feed-through comprising:

a first diffusion control layer extending uninterrupted from an attachment region a distance along an external environment region, a first insulator layer on top of said first diffusion control layer, said first insulator layer extending from a first via positioned within a sealed region to a second via positioned within said external environment region outside of said sealed region, a conductor layer on top of said first insulator layer, said conductor layer electrically connecting said first via and said second via, a second insulator layer on top of said conductor layer, and a second diffusion control layer on top of said second insulator layer, said second diffusion control layer extending uninterrupted across a majority of a length of said electrical feed-through almost to said second via, wherein said first diffusion control layer, said first insulator layer, said second insulator layer, and said second diffusion control layer form a high aspect ratio diffusion channel between said hermetically-sealed internal environment and said external environment.

13. The sealed hard disk drive of claim 12, wherein said diffusion channel has an aspect ratio characterized by a ratio of the width of said diffusion channel over the sum of the heights of said first and said second insulator layers; and wherein, for a target leak rate for a gas within said hermetically-sealed internal environment, said aspect ratio of said diffusion channel is greater than the product of (a) a constant representing the permeability of said gas, (b) a channel perimeter length of said diffusion channel, and (c) a ratio of a pressure drop of said gas along said width of said diffusion channel over said target leak rate.

14. The sealed hard disk drive of claim 12, wherein said second via of said electrical feed-through comprises a via hole, and wherein said via hole is positioned entirely within said external environment region.

15. The sealed hard disk drive of claim 12, wherein said electrical feed-through further comprises:

at least one pair of electrical connection pads comprising a lower electrical connection pad located within said sealed region and an upper electrical connection pad located within said external environment region.

16. The sealed hard disk drive of claim 15, wherein said lower and upper electrical connection pads of said electrical feed-through are electrically connected by way of said first via, said conductor layer and said second via.

17. The sealed hard disk drive of claim 12, wherein at least one of said first and second diffusion control layers of said electrical feed-through is composed of a metal.

18. The sealed hard disk drive of claim 12, wherein at least one of said first and second diffusion control layers of said electrical feed-through is composed of glass.

19. The sealed hard disk drive of claim 12, wherein said electrical feed-through further comprises:

a third via positioned within said sealed region and electrically connecting a high-frequency signal transmission line between a lower electrical connection pad and an upper electrical connection pad, wherein said third via is positioned such that said high-frequency signal transmission line is not routed between said first and second diffusion control layers of said electrical feed-through.

20. A method of sealing an electrical feed-through for use in a hard disk drive and configured to interface between a hermetically-sealed environment and an external environment, the method comprising:
provetiding a first diffusion control layer extending uninterrupted from an attachment region of said electrical feed-through a distance along an external environment region of said electrical feed-through;
providing a first insulator layer on top of said first diffusion control layer, said first insulator layer extending from a first via positioned within a sealed region of said electrical feed-through to a second via positioned within said external environment region outside of said sealed region;
providing a conductor layer on top of said first insulator layer, said conductor layer electrically connecting said first via and said second via;
providing a second insulator layer on top of said conductor layer; and
providing a second diffusion control layer on top of said second insulator layer, said second diffusion control layer extending uninterrupted across a majority of a length of said electrical feed-through almost to said second via;
wherein said first diffusion control layer, said first insulator layer, said second insulator layer, and said second diffusion control layer form a high aspect ratio diffusion channel between said hermetically-sealed environment and said external environment;
wherein said diffusion channel has an aspect ratio characterized by a ratio of the width of said diffusion channel over the sum of the heights of said first and said second insulator layers; and
wherein, for a target leak rate for a gas within said hermetically-sealed environment, said aspect ratio of said diffusion channel is greater than the product of (a) a constant representing the permeability of said gas, (b) a channel perimeter length of said diffusion channel, and (c) a ratio of a pressure drop of said gas along said width of said diffusion channel over said target leak rate.

21. The method of claim 20, further comprising:
providing at least one pair of electrical connection pads comprising a lower electrical connection pad located within said sealed region and an upper electrical connection pad located within said external environment region, wherein said lower and upper electrical connection pads are electrically connected by way of said first via, said conductor layer and said second via.

22. The method of claim 20, further comprising:
providing a third via positioned within said sealed region and electrically connecting a high-frequency signal transmission line between a lower electrical connection pad and an upper electrical connection pad, wherein said third via is positioned such that said high-frequency signal transmission line is not routed between said first and second diffusion control layers.

* * * * *